US006914457B2

(12) United States Patent
Confalonieri et al.

(10) Patent No.: US 6,914,457 B2
(45) Date of Patent: Jul. 5, 2005

(54) DIGITAL SYSTEM WITH AN OUTPUT BUFFER WITH A SWITCHING CURRENT SETTABLE TO LOAD-INDEPENDENT CONSTANT VALUES

(75) Inventors: Pierangelo Confalonieri, Caponago (IT); Angelo Nagari, Cilavegna (IT); Germano Nicollini, Piacenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 47 days.

(21) Appl. No.: 10/460,035

(22) Filed: Jun. 10, 2003

(65) Prior Publication Data

US 2004/0039953 A1 Feb. 26, 2004

(30) Foreign Application Priority Data

Jun. 10, 2002 (EP) .............................. 02425378

(51) Int. Cl.$^7$ ................................ H03B 1/00
(52) U.S. Cl. ...................................... 327/108
(58) Field of Search ........................... 327/108–109, 327/112, 427, 434, 437, 389, 391; 326/81–87, 91

(56) References Cited

U.S. PATENT DOCUMENTS

| 5,451,861 | A | | 9/1995 | Giebel ...................... 323/315 |
| 5,917,758 | A | | 6/1999 | Keeth ..................... 365/189.05 |
| 6,133,751 | A | | 10/2000 | Churcher et al. ............. 326/49 |
| 6,236,237 | B1 | * | 5/2001 | Wong et al. .................. 326/83 |
| 6,281,730 | B1 | | 8/2001 | Vu ............................. 327/170 |
| 6,420,924 | B1 | * | 7/2002 | Lundberg .................... 327/333 |
| 6,445,226 | B2 | * | 9/2002 | Taniguchi ................... 327/112 |
| 6,774,695 | B2 | * | 8/2004 | Hayashi et al. ............. 327/333 |

FOREIGN PATENT DOCUMENTS

| EP | 0 535 873 B1 | 3/1997 |
| EP | 0 575 676 B1 | 12/1997 |

* cited by examiner

Primary Examiner—My-Trang Nu Ton
(74) Attorney, Agent, or Firm—Lisa K. Jorgenson; Robert Iannucci; Seed IP Law Group PLLC

(57) ABSTRACT

A digital system comprises a digital data processing unit, at least one output buffer connected to the processing unit to generate output signals in response to digital signals arriving from the processing unit and at least one user unit connect as output buffer load. With a view to assuring that the switching current of the output buffer can be set to different values, the output buffer comprises means for fixing the switching current to a value that is substantially constant and independent of the load and means for selectively setting the value of the switching current and the processing unit comprises means for storing a predetermined parameter; said means are connected to the selective setting means for setting the values of the switching current as functions of the predetermined parameter.

60 Claims, 5 Drawing Sheets

Figure 1:
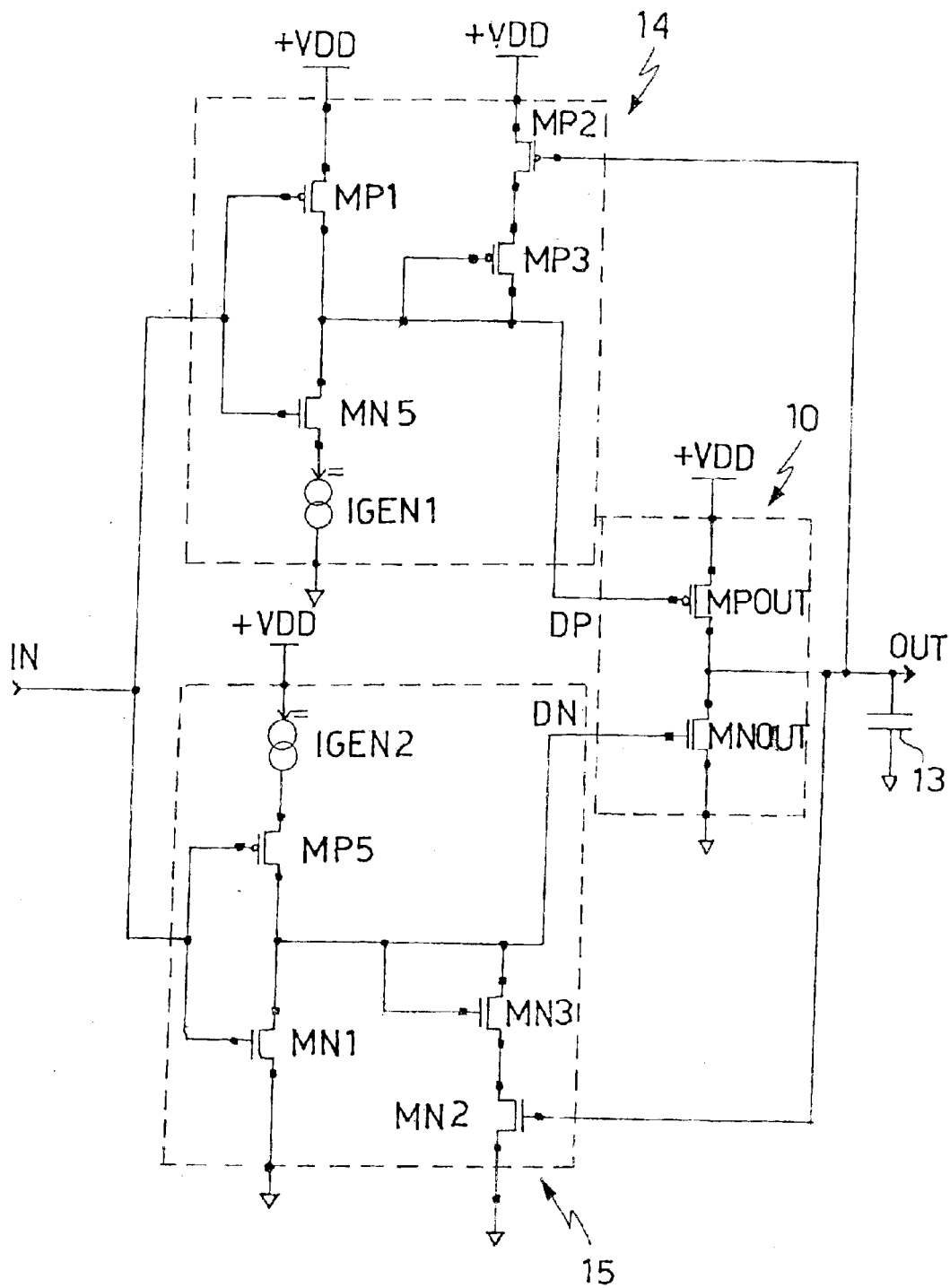

DIGITAL SYSTEM WITH AN OUTPUT BUFFER WITH A SWITCHING CURRENT SETTABLE TO LOAD-INDEPENDENT CONSTANT VALUES

BACKGROUND OF THE INVENTION

1. Field of the Invention

The present invention concerns digital systems consisting of one or more integrated circuits and, more particularly, a digital system comprising a processing unit and at least one output buffer that drives a peripheral unit in response to signals arriving from the processing unit.

2. Description of the Related Art

As is well known, an output buffer for digital signals is an interface circuit that serves to drive a load in response to a digital control signal. A buffer is normally designed and dimensioned on the basis of specifications envisaging operation in direct current, i.e., on the basis of the maximum value of the supply voltage of the integrated circuit of which the buffer forms part and the maximum value of the current to be supplied to a predetermined resistive circuit. As a result of this dimensioning the switching speed of the signal generated by the buffer is often abundantly greater than what is effectively necessary. The switching will therefore give rise to very substantial current pulses, i.e., current transients that can lead to spurious switchings in the integrated circuit and, consequently, loss or alteration of the information associated with the digital signal. In mixed integrated circuits, which contain both digital and analog parts, the current transients can even jeopardize the performance of the analog circuits. Furthermore, the supply unit of the integrated circuit sustains a heavy load during the switchings and this can create a serious problem when the integrated circuit forms part of portable equipment, i.e., equipment with limited energy resources.

If the problems just outlined are to be avoided or at least attenuated, it is essential to design devices in which the connection paths to the supply unit have a section sufficiently large not to cause excessive voltage drops or inductive phenomena, but this implies a larger occupied area and does not solve the problem of the excessive supply unit load. Buffers having various cascading input stages successively controlled with predetermined lag times and buffers with driver circuits capable of regulating the rising and descending fronts of the signals to be transferred as outputs have been proposed to reduce the switching speed. The first solution calls for the use of a relatively large area of the integrated circuit and the second is just as complex. In both solutions, moreover, the buffer output current or, more precisely, the switching current, i.e., the current furnished or absorbed during the transitions of the digital signal provided by the buffer, varies as a function of the load. Indeed, when the load is greater than the optimal load fixed during the design of the circuit, so that the output switching time will be greater than the time that would have been required with the optimal load, the switching current increases in a controlled manner only until the end of the switching time corresponding to the optimal load, but then increases in an altogether uncontrolled manner for the remainder of the switching time. Expressed in terms of voltages, this effect manifests itself as a variation—from a low to a high value—of the slope of the switching fronts of the digital output signals.

BRIEF SUMMARY OF THE INVENTION

An embodiment of the present invention improves the performance of digital systems by limiting the formation of current peaks during the switching of the digital buffer output signals to the greatest possible extent.

An embodiment of the invention is directed to a digital system that includes: a digital data processing unit; an output buffer connected to the processing unit to generate digital output signals in response to digital signals arriving from the processing unit; and a user unit connected as output buffer load. The output buffer includes a first circuit that fixes a switching current of the digital signals at a value that is substantially constant and independent of the load and a second circuit that selectively sets the value of the switching current. The processing unit a register that stores a predetermined parameter and is connected to the second circuit to selectively set the value of the switching current as a function of the predetermined parameter.

BRIEF DESCRIPTION OF THE SEVERAL VIEWS OF THE DRAWING(S)

Figure 2:
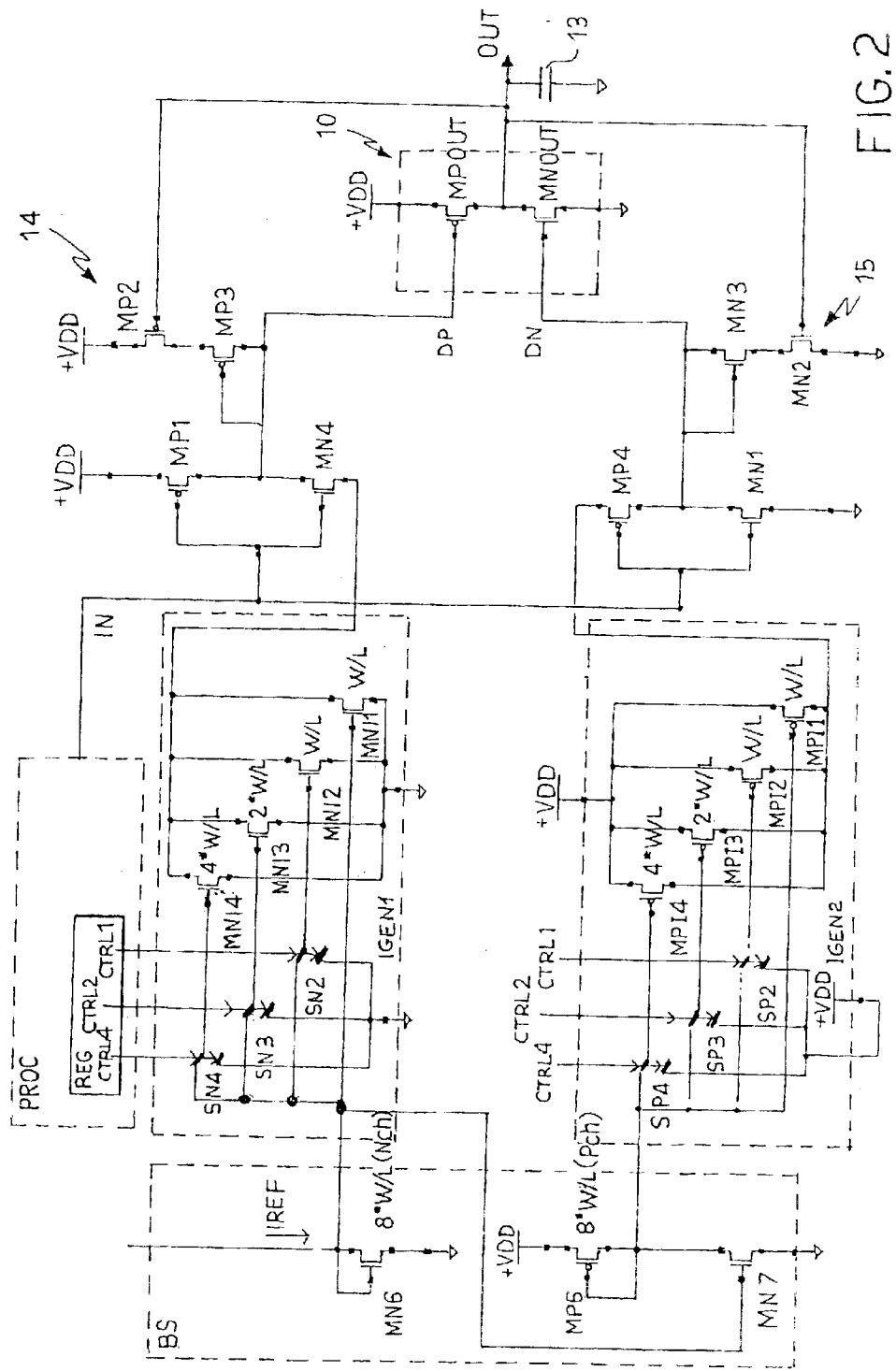
Figure 3:
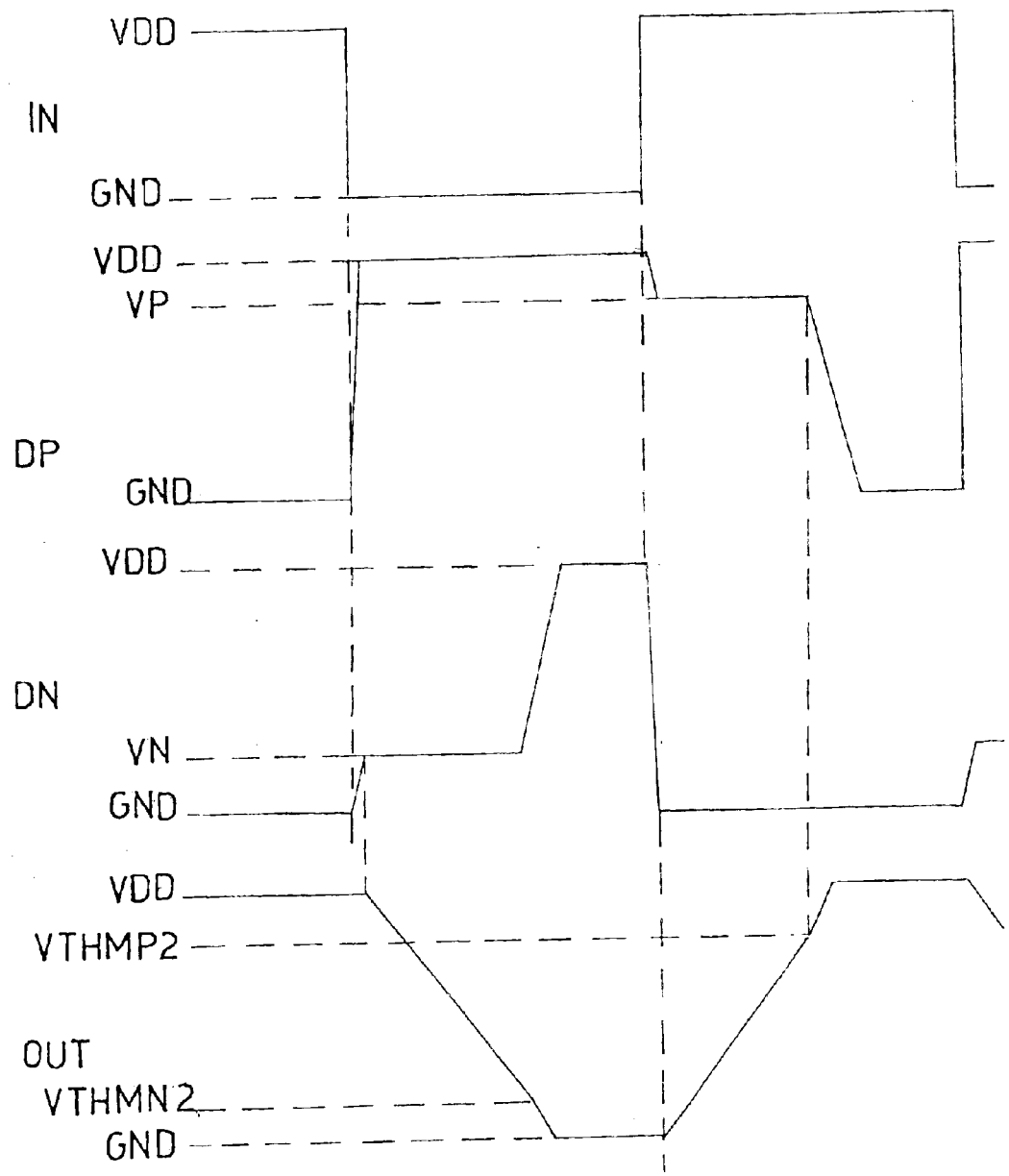
Figure 4:
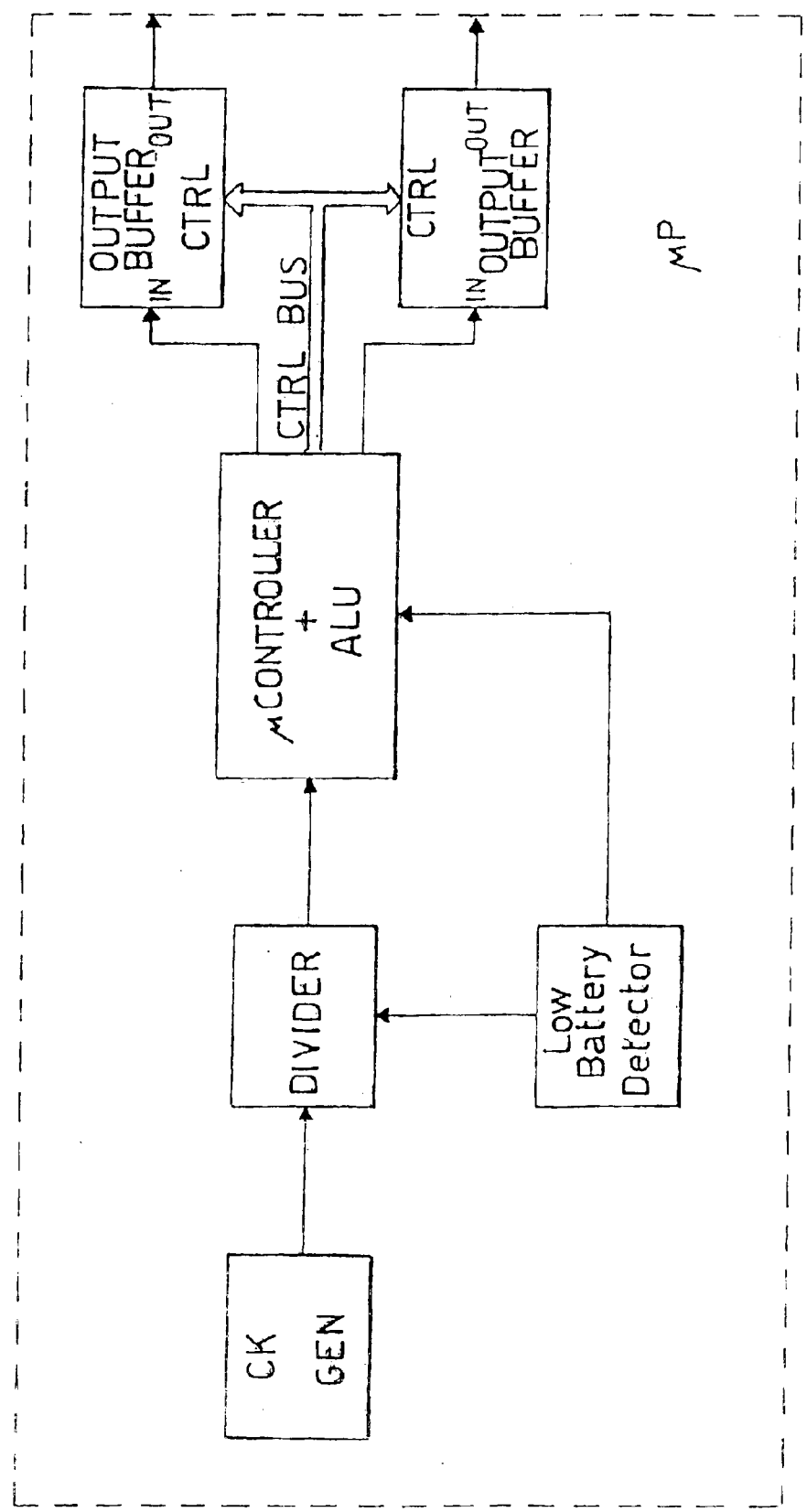
Figure 5:
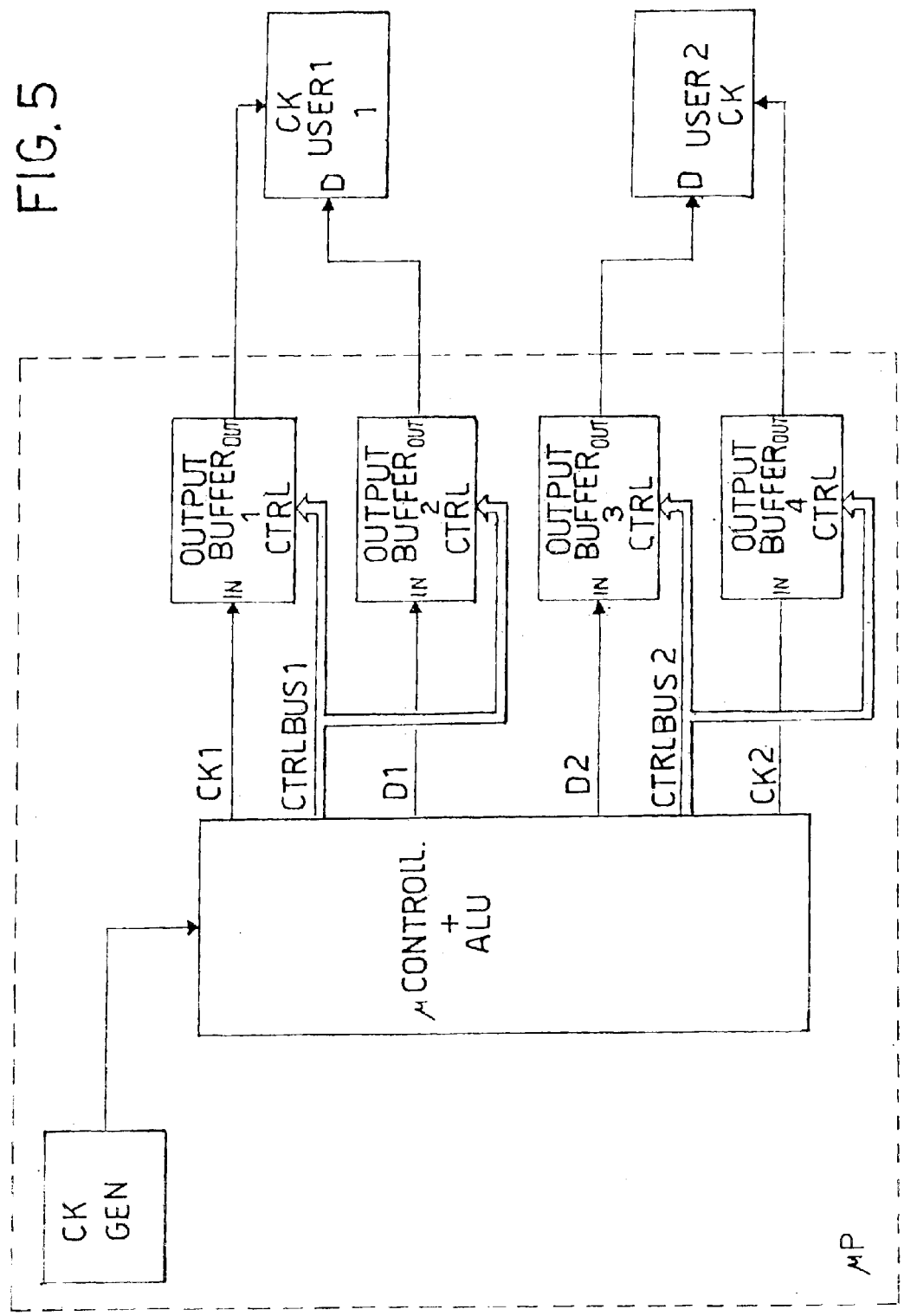

The invention will be understood more clearly from the description about to be given of some embodiments of the invention, which are to be considered as examples and not limitative in any way, said description making reference to the attached drawings of which:

FIG. 1 shows the schematic circuit diagram of a buffer capable of providing a load-independent switching current, FIG. 2 shows the schematic circuit diagram of a first embodiment of a digital system in accordance with the invention, FIG. 3 shows some wave forms that illustrate the functioning of the circuit of FIG. 2, FIG. 4 shows the block diagram of a second embodiment of a digital system in accordance with the invention, and FIG. 5 shows the block diagram of a third embodiment of a digital system in accordance with the invention.

DETAILED DESCRIPTION OF THE INVENTION

One buffer with a constant switching current is proposed in U.S. patent application Ser. No. 10/032,232, filed on Dec. 21, 2001, assigned to STMicroelectronics, Srl, which is the assignee of the present application, which application is incorporated by reference herein in its entirety.

A buffer described in this application is shown in FIG. 1. As can be seen, the buffer has an output stage including two complementary MOS transistors (MPOUT and MNOUT) connected in such a way as to function in counterphase between the terminals (VDD and ground) of a supply voltage source and two driver stages (14 and 15) with a common input IN. Each of the driver stages (14 and 15) has a first and a second branch. The first branch comprises a current generator (IGEN1 and IGEN2) connected—in series with a transistor (MN5 and MP5) acting as electronic switch controlled by the input IN—between the gate electrode of the transistor to be driven (MPOUT and MNOUT) and a supply terminal (ground and VDD) and a second transistor (MP1 and MN1) acting as electronic switch controlled by the input IN and connected between the said gate electrode and the other supply terminal. The second branch is arranged between the gate electrode of the transistor to be driven (MPOUT and MNOUT) and a respective supply terminal (ground and VDD) and comprises the series connection of a diode-connected transistor (MP3 and MN3) and a transistor acting as electronic switch controlled by the output OUT.

The digital system illustrated by FIG. 2, where components equal to those of FIG. 1 are always indicated by the same reference numbers or symbols, comprises a buffer having an output stage 10 with complementary MOSFET transistors and, more precisely, a P-channel transistor MPOUT and an N-channel transistor MNOUT connected in such a way as to function in counterphase between a first supply terminal +VDD and a second supply terminal indicated by the ground symbol. The common node of the two transistors, i.e., the connection node between the two drain electrodes, is the output terminal OUT of the buffer and is connected to a load 13, typically an essentially capacitive load.

The buffer comprise two stages 14 and 15 for driving the transistors of the output stage 10. The driver stage 14 is made up of two circuit branches: the first branch comprises an N-channel MOS transistor MN4, a current generator IGEN1 and a P-channel MOS transistor MP1. The transistor MN4, which performs the function of an electronic switch, has its source electrode connected to ground via the generator IGEN1, its drain electrode connected to the drain of the transistor MP1 and the gate electrode DP of the output transistor MPOUT and its gate electrode connected to the buffer input terminal IN. The transistor MP1, which likewise performs the function of an electronic switch, has its source electrode connected to the supply terminal +VDD and its gate electrode connected to the buffer input terminal IN. The second branch of driver stage 14 comprises a P-channel MOS transistor MP3 in the so-called diode connection, i.e., with its gate and drain connected to each other, in series with a P-channel MOS transistor MP2, which again performs the function of an electronic switch and has its source electrode connected to the supply terminal +VDD. The common electrodes of the transistor MP3 are connected to the gate electrode DP of the output transistor MPOUT, while the gate electrode of the transistor MP2 is connected to the buffer output terminal OUT.

As can be seen from FIG. 2, driver stage 15 includes of a third branch (MP4, IGEN2, MN1) and a fourth branch (MN3, MN2) having structures dual to those of the first and second branch of driver stage 14.

Each of the current generators IGEN1 and IGEN2 has four parallel branches comprising MOS transistors—in the former case N-channel transistors indicated by MNI1-MNI4, in the latter case P-channel transistors indicated by MPI1-MPI4—connected to a biasing circuit, of which only a portion indicated by BS is shown in the figure. A biasing circuit may be provided for other purposes in the integrated circuit, so that the buffer can use this already available circuit. In the example here illustrated the four transistors of the two generators IGEN1 and IGEN2 are connected by means of current-mirroring connections to respective diode-connected transistors—in the former case an N-channel transistor indicated by MN6, in the latter case a P-channel transistor indicated by MP6—that have their source electrodes connected to, respectively, ground and +VDD. The drain electrode of transistor MN6 is connected to a part of the biasing circuit not shown in the figure, from which it receives a constant reference current IREF. Due to a current-mirror coupling between transistor MN6 and another N-channel transistor, equal to MN6 and indicated by MN7, the same current also flows in transistor MP6. In this example it has been assumed that the slope of the rising front of the output signal is equal to the slope of the descending front; if one wants the two slopes to be different, the current mirror has to be designed with a reflection ratio different from unity. The sizes of the transistors of the four branches of each of the generators are such that they will conduct predetermined fractions of the current IREF passing through the transistors MN6 and MP6. One of the four transistors (MNI1 and MPI1) is permanently connected by means of a current-mirror connection, while the other three transistors are connected only when they are habilitated by appropriate signals CTRL1, CTRL2, CTRL4 determined by the state of the binary figures that make up a digital code present in a register REG, In other words, the current of the generators IGEN1 and IGEN2 is determined by the content of the register REG. In the example here considered the sizes of the transistors, i.e., width/length ratio (W/L) of their respective channels, are such that the currents furnished by, respectively, the transistors MNI2, MNI3, MNI4 and MPI2, MPI3, MPI4 will be weighted in binary code. The means for selectively habilitating the transistors of generators IGEN1 and IGEN2 are represented by switches, respectively SN2, SN3, SN4 and SP2, SP3, SP4, capable of connecting the gate electrodes of the transistors, respectively, to ground or to the transistor MN6 and the terminal +VDD or to the transistor MP6. The register REG forms part of a processing unit—indicated by PROC—of the digital system of which the buffer forms part, the same unit that generates the digital signals at the buffer input IN.

Before examining the manner of functioning of the system shown in FIG. 2, it will be as well to make some considerations regarding the nature and the size of the transistors of the buffer. The sizes of the output transistors MPOUT and MNOUT are determined on the basis of the maximum value of the supply voltage and the maximum value of the current that has to be supplied to a resistive load in direct current operation. The transistor MP2 has to function substantially as a switch and must therefore have as low as possible an impedance when it is in the conductive state. The transistor MP3 has to conduct a current that is a predetermined fraction of the current of the output transistor MPOUT and its size must therefore be correspondingly correlated with the size of the transistor MPOUT (typically it will have the same channel length and a width that is a fraction of the width of MPOUT). The transistor MN4 has to function as a switch and must therefore have as low as possible an impedance when it is in the conductive state. The transistor MP1 has likewise to function as a switch in order to quickly interrupt the conduction of the output transistor MPOUT whenever this is necessary and is therefore correspondingly sized. Altogether similar considerations apply as regards the dimensioning of the transistors of driver stage 15 of the output transistor MPOUT.

Referring to FIG. 3, we can now consider the manner in which the buffer functions when it switches a digital signal applied to the input terminal IN from 0 to 1. It is easy to see that in the absence of a signal and the input IN therefore at the level 0, i.e., at ground potential, the output terminal will likewise be at zero potential, because MNOUT is conducting (on) and MPOUT is interdicted (off). When a signal is applied to the terminal IN, MP4 ceases to conduct (off) and MN1 begins to conduct (on) immediately after the signal has risen from 0 to 1. The output transistor MNOUT switches off, because its gate electrode DN is now at 0. In driver stage 14, on the other hand, the same conditions will cause MP1 to switch off and MN4 to conduct. Since the output OUT is at 0, MP2 is on, so that a current will pass through the series connection of MP2, MP3, MN4 and IGEN 1. The voltage at the gate electrode DP of the output transistor MPOUT will be given by VP=VDD−VDS(MP2)−VTH(MP3)−VOD (MP3), i.e., the supply voltage VDD less the voltage drop across MP2, less the threshold drop of MP3, less the voltage beyond the threshold (overdrive) due to the current imposed by IGEN1 in MP3. Indicatively, the voltage at the node DP will be smaller than the supply voltage VDD by an amount comprised between 0.7 and 1.5V, depending on the dimensioning of the various transistors. In these conditions the output transistor MPOUT, which was initially off, begins to conduct a current that is substantially proportional to the current flowing in transistor MP3 and will therefore charge the capacitance of the load 13. The proportionality coefficient is determined by the scale factor, i.e., the dimensional ratio of MPOUT and MP3, and the current of generator IGEN1. This situation is maintained for the entire period of time in which MP2 remains on. When the voltage at the output terminal OUT attains a value equal to VDD less the threshold voltage of MP2 (VTHMP2) less the overdrive of MP2 (very small when MP2 is appropriately dimensioned), MP2 will switch off, thus preventing the passage of current through MP3 and MN4. Since MN4 is still on, because the input IN is at a high level (VDD), the node DP now goes to zero, MPOUT continues to conduct and the output OUT goes to +VDD.

The rise of the voltage at the output OUT to +VDD occurs at a constant slew rate for the greater part of the excursion, i.e., the part that is substantially determined only by the current that is mirrored from MP3 to MPOUT, which is the current of generator IGEN1. The small residual excursion is controlled by the rate at which the voltage at the node DP drops to zero, i.e., by the capacitance associated with the node (which is essentially the gate capacitance of MPOUT), and does not involve any appreciable increase of the current of the output transistor MPOUT, which in these conditions works in the linear zone.

When the input IN goes from 1 to 0, the output OUT switches from 1 to 0 in a manner that is exactly specular to what has been described above.

As is clearly brought out by what has just been explained, the current that the buffer here considered furnishes to the load 13 or is absorbed by that load during the signal transitions is substantially independent of the load and is essentially determined by the dimensioning of the driver stages 14 and 15 and the current of the generators IGEN1 and IGEN2. Consequently, the switching current, and with it also the slope of the switching fronts in the wave forms of FIG. 3, can always be fixed at the optimal value for every situation by simply setting a corresponding digital datum in the register REG. It is clear that the accuracy of this regulation depends on the values that may be assumed by the current of the generators IGEN1 and IGEN2, i.e., on the number of parallel branches of which they are made up and the corresponding number of digits of the binary code stored in the register REG, and can therefore be chosen in the circuit design phase in accordance with effective needs.

The system described above can be advantageously used, for example, in the analysis phase of the design of a device intended to find and correct defects (debugging). A possible defect associated with the switching of the digital outputs can be pinpointed by arranging for the buffer to operate with different values of the switching current.

Another advantageous embodiment of the digital system in accordance with the invention is the microprocessor of a portable computer schematically illustrated by FIG. 4. As is well known, a typical problem of portable computers is constituted by the management of the energy resources. In order to assure proper functioning of the system even when the supply battery is almost flat, it has become a normal practice to reduce the clock frequency. This expedient, which slows down the system, makes it possible to reduce the current absorbed from the battery, i.e., to avoid the supply voltage dropping to below a minimum safety value. Nevertheless, this reduction does not affect the switching speed of the signals generated by the output buffer and does not therefore solve the previously described problems, namely current transients and sudden surges of the battery load.

The block diagram of FIG. 4 illustrates the structure of a portable computer microprocessor $\mu$P in a somewhat simplified form. It comprises a microcontroller ($\mu$CONTROLLER+ALU), i.e., a processing, control and calculation unit, and two output buffers (OUTPUT BUFFER) like those shown in FIG. 2, each of which has a signal input IN connected to the microcontroller and a control input CTRL likewise connected to the microcontroller by means of a bus (CTRL BUS). The microprocessor also comprises a low-battery-detector, a clock generator (CK GEN) and a clock divider (DIVIDER).

When functioning, a low-charge signal is applied to the clock divider, which has the effect of reducing the functioning frequency of the microcontroller. The same signal is received and processed by the microcontroller to determine a parameter that is transmitted to the control inputs of the buffer to set a switching current and therefore a switching speed of the output signals that is lower than in normal functioning. If necessary, it is also possible to generate different regulating parameters for different low-charge levels, thereby assuring that an optimal exploitation of the residual energy resources will always be obtained.

FIG. 5 again shows a microprocessor $\mu$P comprising a microcontroller ($\mu$CONTROLLER+ALU), a clock generator (CK GEN) and four output buffers (OUTPUT BUFFERS 1–4) like those illustrated in FIG. 2, each of which has a signal input IN connected to the microcontroller and a control input CTRL likewise connected to the microcontroller by means of a bus CTRL BUS 1, CTRL BUS 2. The buffer outputs OUT are connected to two user units, respectively USER 1 and USER 2, which can be circuits or devices either within or outside the microprocessor $\mu$P. In case of internal circuits, the buffer loads will comprise the capacitances associated with the internal connecting bus, while in the case of external circuits or devices the loads of the two buffers will comprise the capacitances of the pins of the integrated circuit. In this example it will be assumed that the two user units are external and have to be driven by different signals D1, D2 at different clock frequencies CK1, CK2 by means of their respective clock output buffers, respectively OUTPUT BUFFER 1, OUTPUT BUFFER 4, and data output buffers, respectively OUTPUT BUFFER 2, OUTPUT BUFFER 3. It is possible, of course, to provide a number of user units much greater than two.

As far as the functioning is concerned, the microcontroller determines for each buffer a switching current regulation parameter that takes account of, for example, the specific needs of the various user units needs. The regulation criterion for each user unit can be programmed in the microcontroller in such a way as to optimize the performance, the energy resource management or other operating characteristics of the system.

By way of example, starting from the supposition that the microcontroller controls the user units USER1 and USER2 and therefore knows their respective operating characteristics at each instant and that one of the user units can be driven at different frequencies at different times, the microcontroller program can assign such values to the switching current of the driver buffers of the user units as may be most appropriate at any given moment. Furthermore, the program can take account of the possibility of individually controlling the switching currents of the buffers in such a way as to reduce the value of the maximum current peak for which the supply unit has to be designed. With a view to further clarifying this concept, we shall now consider the example of the application of the simple two-user system shown in FIG. 5.

Let us suppose that when USER1 functions at 100 MHz, USER2 has to function at 50 MHz and vice versa. If I is the current that the buffers need to drive the user unit functioning at 100 MHz, I/2 will be the current that the buffers need to drive the unit functioning at 50 MHz. If dynamic buffer current management in accordance with the invention, i.e., the possibility of individually controlling the buffer currents as functions of the specific needs of the user needs, were not available, it would be necessary to make the buffers function all the time with the maximum current, namely I, so that the maximum current requirement for switching peaks would amount to 2I. Given dynamic management of the buffer currents, on the other hand, the maximum current requirement is 1.5I, so that the size of the supply unit can be correspondingly reduced.

Combining the regulations illustrated by FIGS. 4 and 5, moreover, it is possible to sum the advantages deriving from each of them. Coming back to the example illustrated by FIG. 5, in the case in which the clock is reduced ten times, following the detection of a low battery level, the maximum current peak to be taken into consideration for the design of the supply unit would be 1.5I/10 rather than the 2I/10 that would be needed without dynamic management of the buffer currents.

Though only a few embodiments of the invention have here been described and illustrated, it is clear that numerous variants and modifications can be introduced without overstepping the bounds of the inventive concept. For example, in place of the buffers of the type described in relation to FIG. 2 it would be possible to use other types of buffers, always provided that they be capable of producing output signals having substantially constant and load-independent switching currents.

All of the above U.S. patents, U.S. patent application publications, U.S. patent applications, foreign patents, foreign patent applications and non-patent publications referred to in this specification and/or listed in the Application Data Sheetare incorporated herein by reference, in their entirety.

What is claimed is:

1. A digital system comprising:
   a digital data processing unit;
   an output buffer connected to the processing unit to generate digital output signals in response to digital signals arriving from the processing unit; and
   a user unit connected as output buffer load,
   wherein the output buffer comprises means for fixing a switching current of the digital signals at a value that is substantially constant and independent of the load and means for selectively setting the value of the switching current and wherein the processing unit comprises means for storing a predetermined parameter, said means for storing the predetermined parameter being connected to the means for selectively setting the value of the switching current as a function of the predetermined parameter.

2. A system in accordance with claim 1, wherein the means for fixing the switching current comprise a current generator having a current that is programmed by the selective setting means.

3. A system in accordance with claim 2, wherein the current generator comprises a multiplicity of current generator branches connected in parallel with each other and having respective control terminals and wherein the means for storing a predetermined parameter comprise a register that stores the predetermined parameter in digital form and has output terminals connected to respective control terminals of the current generator branches to activate and deactivate them individually according to a state of binary digits that constitute the parameter in digital form.

4. A system in accordance with claim 1, wherein the predetermined parameter is an index of a charge level of a battery that feeds the system.

5. A system in accordance with claim 1, wherein the predetermined parameter is an operating parameter of the system.

6. A system in accordance with claim 5 comprising a multiplicity of output buffers and a multiplicity of user units driven by the output buffers, wherein the processing unit comprises means for programming a multiplicity of parameters for setting values of the switching currents of the various buffers as functions of operating parameters of the user units.

7. A digital system comprising:
   a digital data processing unit; and
   an output buffer connected to the processing unit to generate digital output signals in response to digital signals arriving from the processing unit, the output buffer including a first driving stage coupled to the processing unit, and having:
   an output;
   a controlled, first current generator connected between the output and a first voltage reference, the first current generator including:
   an input;
   a first current switch coupled between the output of the first driving stage and the first voltage reference, the first current switch having a control terminal; and
   a first control switch coupled between the control terminal of the first current switch and the input of the first current generator, the first control switch having a control terminal coupled to and controlled by the processing unit; and
   a bias transistor through which a reference current flows, the bias transistor having an output connected to the input of the first current generator such that the bias transistor forms a current mirror with the first current switch when the first control switch is conducting.

8. The system of claim 7, wherein the first current generator includes plural current generator branches connected in parallel with each other, one of the current generator branches including the first current switch and the first control switch, the current generator branches having respective control terminals and wherein the processing unit includes a register that stores a predetermined parameter in digital form and has output terminals connected to respective control terminals of the current generator branches to activate and deactivate them individually according to a state of binary digits that constitute the parameter in digital form.

9. The system of claim 7, further comprising a battery detector, coupled to the processor, that detects when a battery of the system is low and causes the processor to reduce the current provided by the first current generator.

10. The system of claim 7, wherein the output buffer includes an output stage connected between the output of the first driving stage and an output of the output buffer, the first driving stage including a first branch that includes the current generator and a second branch that includes a transistor and diode connected in series between a second voltage reference and the output of the first driving stage, the transistor including a control terminal connected to the output of the output buffer.

11. The system of claim 7, wherein the output buffer includes:
   an output stage having a first output transistor connected between a second voltage reference and an output of the output buffer and a second output transistor connected between the first voltage reference and the output of the output buffer, the first output transistor having a control terminal connected to the output of the first driving stage, and the second output transistor having a control terminal;
   a second driving stage having an output connected to the control terminal of the second output transistor and including a second current generator connected between the output of the second driving stage and the second voltage reference, the second current generator including:

an input;
a second current switch coupled between the output of the second driving stage and the second voltage reference, the second current switch having a control terminal; and
a second control switch coupled between the control terminal of the second current switch and the input of the second current generator, the second control switch having a control terminal coupled to and controlled by the processing unit.

12. The system of claim 7, wherein the output buffer includes:
an output stage having a first output transistor with a control terminal connected to the output of the first driving stage, and a second output transistor with a control terminal;
a second driving stage having an output connected to the control terminal of the second output transistor and including a second current generator connected between the output of the second driving stage and a second voltage reference, the system further comprising a bias unit that includes:
a diode-connected, first bias transistor connected between the first voltage reference and the input of the first current generator;
a diode-connected, second bias transistor connected between the second voltage reference and an input of the second current generator; and
a third bias transistor connected in series with the second bias transistor and having a control terminal connected to the input of the first current generator.

13. The system of claim 7 wherein the output buffer is one of a plurality of output buffers, the system further comprising a plurality of user units driven respectively by the output buffers, wherein the processing unit comprises means for programming a multiplicity of parameters for setting values of switching currents of the buffers as functions of operating parameters of the respective user units.

14. The system of claim 7 wherein the first current generator includes a second current switch connected in parallel with the first current switch and having a control terminal connected directly to the input of the first current generator.

15. A buffer, comprising:
an output stage having an input and an output; and
a first driving stage having:
an output coupled to the input of the output stage;
a controlled, first current generator connected between the output of the first driving stage and a first voltage reference, the first current generator including:
an input;
a first current switch coupled between the output of the first driving stage and the first voltage reference, the first current switch having a control terminal; and
a first control switch coupled between the control terminal of the first current switch and the input of the first current generator, the first control switch having a control terminal for receiving a control input signal; and
a bias transistor through which a reference current flows, the bias transistor having an output connected to the input of the first current generator such that the bias transistor forms a current mirror with the first current switch when the first control switch is conducting.

16. The buffer of claim 15, wherein the first driving stage including a first branch that includes the first current generator and a second branch that includes a transistor and diode connected in series between a second voltage reference and the output of the first driving stage, the transistor including a control terminal connected to the output of the output buffer.

17. The buffer of claim 15, wherein the output stage includes a first output transistor connected between a second voltage reference and the output of the output stage and a second output transistor connected between the first voltage reference and the output of the output stage, the first output transistor having a control terminal connected to the output of the first driving stage, and the second output transistor having a control terminal, the buffer further comprising:
a second driving stage having an output connected to the control terminal of the second output transistor and including a second current generator connected between the output of the second driving stage and the second voltage reference, the second current generator including:
an input;
a second current switch coupled between the output of the second driving stage and the second voltage reference, the second current switch having a control terminal; and
a second control switch coupled between the control terminal of the second current switch and the input of the second current generator, the second control switch having a control terminal for receiving the control input signal.

18. The buffer of claim 15, wherein the output stage includes a first output transistor with a control terminal connected to the output of the first driving stage, and a second output transistor with a control terminal, the buffer further comprising:
a second driving stage having an output connected to the control terminal of the second output transistor and including a second current generator connected between the output of the second driving stage and a second voltage reference; and
a bias unit that includes:
a diode-connected, first bias transistor connected between the first voltage reference and the input of the first current generator;
a diode-connected, second bias transistor connected between the second voltage reference and an input of the second current generator; and
a third bias transistor connected in series with the second bias transistor and having a control terminal connected to the input of the first current generator.

19. The system of claim 15 wherein the first current generator includes a second current switch connected in parallel with the first current switch and having a control terminal connected directly to the input of the first current generator.

20. A digital system comprising:
a digital data processing unit; and
an output buffer connected to the processing unit to generate digital output signals in response to digital signals arriving from the processing unit, the output buffer including a first driving stage coupled to the processing unit and having an output and a controlled, first current generator connected between the output and a first voltage reference, the first current generator including:

an input;
a first current switch coupled between the output of the first driving stage and the first voltage reference, the first current switch having a control terminal; and
a first control switch coupled between the control terminal of the first current switch and the input of the first current generator, the first control switch having a control terminal coupled to and controlled by the processing unit, wherein the first current generator includes plural current generator branches connected in parallel with each other, one of the current generator branches including the first current switch and the first control switch, the current generator branches having respective control terminals and wherein the processing unit includes a register that stores a predetermined parameter in digital form and has output terminals connected to respective control terminals of the current generator branches to activate and deactivate them individually according to a state of binary digits that constitute the parameter in digital form.

21. The system of claim 20, further comprising a battery detector, coupled to the processor, that detects when a battery of the system is low and causes the processor to reduce the current provided by the first current generator.

22. The system of claim 20, wherein the output buffer includes an output stage connected between the output of the first driving stage and an output of the output buffer, the first driving stage including a first branch that includes the current generator and a second branch that includes a transistor and diode connected in series between a second voltage reference and the output of the first driving stage, the transistor including a control terminal connected to the output of the output buffer.

23. The system of claim 20, further comprising a bias transistor having an output connected to the input of the first current generator such that the bias transistor forms a current mirror with the second current switch, the bias transistor having a size that is a whole multiple of a size of the second current switch.

24. The system of claim 20, wherein the output buffer includes:
an output stage having a first output transistor connected between a second voltage reference and an output of the output buffer and a second output transistor connected between the first voltage reference and the output of the output buffer, the first output transistor having a control terminal connected to the output of the first driving stage, and the second output transistor having a control terminal;
a second driving stage having an output connected to the control terminal of the second output transistor and including a second current generator connected between the output of the second driving stage and the second voltage reference, the second current generator including:
an input;
a second current switch coupled between the output of the second driving stage and the second voltage reference, the second current switch having a control terminal; and
a second control switch coupled between the control terminal of the second current switch and the input of the second current generator, the second control switch having a control terminal coupled to and controlled by the processing unit.

25. The system of claim 20, wherein the output buffer includes:

an output stage having a first output transistor with a control terminal connected to the output of the first driving stage, and a second output transistor with a control terminal;
a second driving stage having an output connected to the control terminal of the second output transistor and including a second current generator connected between the output of the second driving stage and a second voltage reference, the system further comprising a bias unit that includes:
a diode-connected, first bias transistor connected between the first voltage reference and the input of the first current generator;
a diode-connected, second bias transistor connected between the second voltage reference and an input of the second current generator; and
a third bias transistor connected in series with the second bias transistor and having a control terminal connected to the input of the first current generator.

26. The system of claim 20 wherein the output buffer is one of a plurality of output buffers, the system further comprising a plurality of user units driven respectively by the output buffers, wherein the processing unit comprises means for programming a multiplicity of parameters for setting values of switching currents of the buffers as functions of operating parameters of the respective user units.

27. The system of claim 20 wherein the first current generator includes a second current switch connected in parallel with the first current switch and having a control terminal connected directly to the input of the first current generator.

28. A digital system comprising:
a digital data processing unit;
an output buffer connected to the processing unit to generate digital output signals in response to digital signals arriving from the processing unit, the output buffer including a first driving stage coupled to the processing unit and having an output and a controlled, first current generator connected between the output and a first voltage reference, the first current generator including:
an input;
a first current switch coupled between the output of the first driving stage and the first voltage reference, the first current switch having a control terminal; and
a first control switch coupled between the control terminal of the first current switch and the input of the first current generator, the first control switch having a control terminal coupled to and controlled by the processing unit; and a battery detector, coupled to the processor, that detects when a battery of the system is low and causes the processor to reduce the current provided by the first current generator.

29. The system of claim 28, wherein the output buffer includes an output stage connected between the output of the first driving stage and an output of the output buffer, the first driving stage including a first branch that includes the current generator and a second branch that includes a transistor and diode connected in series between a second voltage reference and the output of the first driving stage, the transistor including a control terminal connected to the output of the output buffer.

30. The system of claim 28, wherein the output buffer includes:
an output stage having a first output transistor connected between a second voltage reference and an output of the output buffer and a second output transistor connected between the first voltage reference and the output of the output buffer, the first output transistor having a control terminal connected to the output of the first driving stage, and the second output transistor having a control terminal;

a second driving stage having an output connected to the control terminal of the second output transistor and including a second current generator connected between the output of the second driving stage and the second voltage reference, the second current generator including:

an input;

a second current switch coupled between the output of the second driving stage and the second voltage reference, the second current switch having a control terminal; and a second control switch coupled between the control terminal of the second current switch and the input of the second current generator, the second control switch having a control terminal coupled to and controlled by the processing unit.

31. The system of claim 28, wherein the output buffer includes:

an output stage having a first output transistor with a control terminal connected to the output of the first driving stage, and a second output transistor with a control terminal;

a second driving stage having an output connected to the control terminal of the second output transistor and including a second current generator connected between the output of the second driving stage and a second voltage reference, the system further comprising a bias unit that includes:

a diode-connected, first bias transistor connected between the first voltage reference and the input of the first current generator;

a diode-connected, second bias transistor connected between the second voltage reference and an input of the second current generator; and a third bias transistor connected in series with the second bias transistor and having a control terminal connected to the input of the first current generator.

32. The system of claim 28 wherein the output buffer is one of a plurality of output buffers, the system further comprising a plurality of user units driven respectively by the output buffers, wherein the processing unit comprises means for programming a multiplicity of parameters for setting values of switching currents of the buffers as functions of operating parameters of the respective user units.

33. The system of claim 28 wherein the first current generator includes a second current switch connected in parallel with the first current switch and having a control terminal connected directly to the input of the first current generator.

34. A digital system comprising:

a digital data processing unit; and an output buffer connected to the processing unit to generate digital output signals in response to digital signals arriving from the processing unit, the output buffer including a first driving stage coupled to the processing unit and having an output and a controlled, first current generator connected between the output and a first voltage reference, the first current generator including:

an input;

a first current switch coupled between the output of the first driving stage and the first voltage reference, the first current switch having a control terminal; and a first control switch coupled between the control terminal of the first current switch and the input of the first current generator, the first control switch having a control terminal coupled to and controlled by the processing unit, wherein the output buffer includes an output stage connected between the output of the first driving stage and an output of the output buffer, the first driving stage including a first branch that includes the current generator and a second branch that includes a transistor and diode connected in series between a second voltage reference and the output of the first driving stage, the transistor including a control terminal connected to the output of the output buffer.

35. The system of claim 34, wherein the output stage includes a first output transistor connected between a second voltage reference and an output of the output buffer and a second output transistor connected between the first voltage reference and the output of the output buffer, the first output transistor having a control terminal connected to the output of the first driving stage, and the second output transistor having a control terminal, the output buffer further including:

a second driving stage having an output connected to the control terminal of the second output transistor and including a second current generator connected between the output of the second driving stage and the second voltage reference, the second current generator including:

an input;

a second current switch coupled between the output of the second driving stage and the second voltage reference, the second current switch having a control terminal; and a second control switch coupled between the control terminal of the second current switch and the input of the second current generator, the second control switch having a control terminal coupled to and controlled by the processing unit.

36. The system of claim 34, wherein the output stage includes a first output transistor with a control terminal connected to the output of the first driving stage, and a second output transistor with a control terminal; the output buffer further including:

a second driving stage having an output connected to the control terminal of the second output transistor and including a second current generator connected between the output of the second driving stage and a second voltage reference, the system further comprising a bias unit that includes:

a diode-connected, first bias transistor connected between the first voltage reference and the input of the first current generator;

a diode-connected, second bias transistor connected between the second voltage reference and an input of the second current generator; and a third bias transistor connected in series with the second bias transistor and having a control terminal connected to the input of the first current generator.

37. The system of claim 34 wherein the output buffer is one of a plurality of output buffers, the system further comprising a plurality of user units driven respectively by the output buffers, wherein the processing unit comprises means for programming a multiplicity of parameters for setting values of switching currents of the buffers as functions of operating parameters of the respective user units.

38. The system of claim 34 wherein the first current generator includes a second current switch connected in parallel with the first current switch and having a control terminal connected directly to the input of the first current generator.

39. A digital system comprising:
a digital data processing unit; and
an output buffer connected to the processing unit to generate digital output signals in response to digital signals arriving from the processing unit, the output buffer including:
  a first driving stage coupled to the processing unit and having an output and a controlled, first current generator connected between the output and a first voltage reference, the first current generator including:
    an input;
    a first current switch coupled between the output of the first driving stage and the first voltage reference, the first current switch having a control terminal; and
    a first control switch coupled between the control terminal of the first current switch and the input of the first current generator, the first control switch having a control terminal coupled to and controlled by the processing unit; an output stage having a first output transistor connected between a second voltage reference and an output of the output buffer and a second output transistor connected between the first voltage reference and the output of the output buffer, the first output transistor having a control terminal connected to the output of the first driving stage, and the second output transistor having a control terminal; and
  a second driving stage having an output connected to the control terminal of the second output transistor and including a second current generator connected between the output of the second driving stage and the second voltage reference, the second current generator including:
    an input;
    a second current switch coupled between the output of the second driving stage and the second voltage reference, the second current switch having a control terminal; and
    a second control switch coupled between the control terminal of the second current switch and the input of the second current generator, the second control switch having a control terminal coupled to and controlled by the processing unit.

40. The system of claim 39, further comprising a bias unit that includes:
a diode-connected, first bias transistor connected between the first voltage reference and the input of the first current generator;
a diode-connected, second bias transistor connected between the second voltage reference and an input of the second current generator; and
a third bias transistor connected in series with the second bias transistor and having a control terminal connected to the input of the first current generator.

41. The system of claim 39 wherein the output buffer is one of a plurality of output buffers, the system further comprising a plurality of user units driven respectively by the output buffers, wherein the processing unit comprises means for programming a multiplicity of parameters for setting values of switching currents of the buffers as functions of operating parameters of the respective user units.

42. The system of claim 39 wherein the first current generator includes a second current switch connected in parallel with the first current switch and having a control terminal connected directly to the input of the first current generator.

43. A digital system comprising:
a digital data processing unit;
an output buffer connected to the processing unit to generate digital output signals in response to digital signals arriving from the processing unit, the output buffer including a first driving stage coupled to the processing unit and having an output and a controlled, first current generator connected between the output and a first voltage reference, the first current generator including:
  an input;
  a first current switch coupled between the output of the first driving stage and the first voltage reference, the first current switch having a control terminal; and
  a first control switch coupled between the control terminal of the first current switch and the input of the first current generator, the first control switch having a control terminal coupled to and controlled by the processing unit; and a bias unit that includes:
  a diode-connected, first bias transistor connected between the first voltage reference and the input of the first current generator;
  a diode-connected, second bias transistor connected between the second voltage reference and an input of the second current generator; and
  a third bias transistor connected in series with the second bias transistor and having a control terminal connected to the input of the first current generator.

44. The system of claim 43 wherein the output buffer is one of a plurality of output buffers, the system further comprising a plurality of user units driven respectively by the output buffers, wherein the processing unit comprises means for programming a multiplicity of parameters for setting values of switching currents of the buffers as functions of operating parameters of the respective user units.

45. The system of claim 43 wherein the first current generator includes a second current switch connected in parallel with the first current switch and having a control terminal connected directly to the input of the first current generator.

46. A digital system comprising:
a digital data processing unit; and
an output buffer connected to the processing unit to generate digital output signals in response to digital signals arriving from the processing unit, the output buffer including a first driving stage coupled to the processing unit, and having:
an output;
a controlled, first current generator connected between the output and a first voltage reference, the first current generator including:
  an input;
  a first current switch coupled between the output of the first driving stage and the first voltage reference, the first current switch having a control terminal; and
  a first control switch coupled between the control terminal of the first current switch and the input of the first current generator, the first control switch having a control terminal coupled to and controlled by the processing unit, wherein the output buffer is one of a plurality of output buffers, the system further comprising a plurality of user units driven respectively by the output buffers, wherein the processing unit comprises means for programming a multiplicity of parameters for setting values of switching currents of the buffers as functions of operating parameters of the respective user units.

47. The system of claim 46 wherein the first current generator includes a second current switch connected in parallel with the first current switch and having a control terminal connected directly to the input of the first current generator.

48. A digital system comprising:
a digital data processing unit; and
an output buffer connected to the processing unit to generate digital output signals in response to digital signals arriving from the processing unit, the output buffer including a driving stage coupled to the processing unit and having an output and a controlled current generator connected between the output and a voltage reference, the current generator including:
an input;
a first current switch coupled between the output of the driving stage and the voltage reference, the first current switch having a control terminal;
a control switch coupled between the control terminal of the first current switch and the input of the current generator, the control switch having a control terminal coupled to and controlled by the processing unit; and
a second current switch connected in parallel with the first current switch and having a control terminal connected directly to the input of the current generator.

49. The system of claim 48, further comprising a bias transistor having an output connected to the input of the first current generator such that the bias transistor forms a current mirror with the second current switch, the bias transistor having a size that is a whole multiple of a size of the second current switch.

50. A buffer, comprising:
an output stage having an input and an output; and
a first driving stage having:
an output coupled to the input of the output stage;
a controlled, first current generator connected between the output of the first driving stage and a first voltage reference, the first current generator including:
an input;
a first current switch coupled between the output of the first driving stage and the first voltage reference, the first current switch having a control terminal; and
a first control switch coupled between the control terminal of the first current switch and the input of the first current generator, the first control switch having a control terminal for receiving a control input signal, wherein the first driving stage includes a first branch that includes the first current generator and a second branch that includes a transistor and diode connected in series between a second voltage reference and the output of the first driving stage, the transistor including a control terminal connected to the output of the output buffer.

51. The buffer of claim 50, wherein the output stage includes a first output transistor connected between a second voltage reference and the output of the output stage and a second output transistor connected between the first voltage reference and the output of the output stage, the first output transistor having a control terminal connected to the output of the first driving stage, and the second output transistor having a control terminal, the buffer further comprising:
a second driving stage having an output connected to the control terminal of the second output transistor and including a second current generator connected between the output of the second driving stage and the second voltage reference, the second current generator including:
an input;
a second current switch coupled between the output of the second driving stage and the second voltage reference, the second current switch having a control terminal; and
a second control switch coupled between the control terminal of the second current switch and the input of the second current generator, the second control switch having a control terminal for receiving the control input signal.

52. The buffer of claim 50, wherein the output stage includes a first output transistor with a control terminal connected to the output of the first driving stage, and a second output transistor with a control terminal, the buffer further comprising:
a second driving stage having an output connected to the control terminal of the second output transistor and including a second current generator connected between the output of the second driving stage and a second voltage reference; and
a bias unit that includes:
a diode-connected, first bias transistor connected between the first voltage reference and the input of the first current generator;
a diode-connected, second bias transistor connected between the second voltage reference and an input of the second current generator; and
a third bias transistor connected in series with the second bias transistor and having a control terminal connected to the input of the first current generator.

53. The system of claim 50 wherein the first current generator includes a second current switch connected in parallel with the first current switch and having a control terminal connected directly to the input of the first current generator.

54. A buffer, comprising:
an output stage having an input and an output;
a first driving stage having:
an output coupled to the input of the output stage;
a controlled, first current generator connected between the output of the first driving stage and a first voltage reference, the first current generator including:
an input;
a first current switch coupled between the output of the first driving stage and the first voltage reference, the first current switch having a control terminal; and
a first control switch coupled between the control terminal of the first current switch and the input of the first current generator, the first control switch having a control terminal for receiving a control input signal, wherein the output stage includes a first output transistor connected between a second voltage reference and the output of the output stage and a second output transistor connected between the first voltage reference and the output of the output stage, the first output transistor having a control terminal connected to the output of the first driving stage, and the second output transistor having a control terminal; and a second driving stage having an output connected to the control terminal of the second output transistor and including a second current generator connected between the output of the second driving stage and the second voltage reference, the second current generator including:

an input;

a second current switch coupled between the output of the second driving stage and the second voltage reference, the second current switch having a control terminal; and a second control switch coupled between the control terminal of the second current switch and the input of the second current generator, the second control switch having a control terminal for receiving the control input signal.

55. The buffer of claim 54, further comprising:

a bias unit that includes:

a diode-connected, first bias transistor connected between the first voltage reference and the input of the first current generator;

a diode-connected, second bias transistor connected between the second voltage reference and an input of the second current generator; and a third bias transistor connected in series with the second bias transistor and having a control terminal connected to the input of the first current generator.

56. The system of claim 54 wherein the first current generator includes a second current switch connected in parallel with the first current switch and having a control terminal connected directly to the input of the first current generator.

57. A buffer, comprising:

an output stage having an input and an output;

a first driving stage having:

an output coupled to the input of the output stage;

a controlled, first current generator connected between the output of the first driving stage and a first voltage reference, the first current generator including:

an input;

a first current switch coupled between the output of the first driving stage and the first voltage reference, the first current switch having a control terminal; and a first control switch coupled between the control terminal of the first current switch and the input of the first current generator, the first control switch having a control terminal for receiving a control input signal, wherein the output stage includes a first output transistor with a control terminal connected to the output of the first driving stage, and a second output transistor with a control terminal;

a second driving stage having an output connected to the control terminal of the second output transistor and including a second current generator connected between the output of the second driving stage and a second voltage reference; and a bias unit that includes:

a diode-connected, first bias transistor connected between the first voltage reference and the input of the first current generator;

a diode-connected, second bias transistor connected between the second voltage reference and an input of the second current generator; and a third bias transistor connected in series with the second bias transistor and having a control terminal connected to the input of the first current generator.

58. The system of claim 57 wherein the first current generator includes a second current switch connected in parallel with the first current switch and having a control terminal connected directly to the input of the first current generator.

59. A buffer, comprising:

an output stage having an input and an output; and a first driving stage having:

an output coupled to the input of the output stage;

a controlled, first current generator connected between the output of the first driving stage and a first voltage reference, the first current generator including:

an input;

a first current switch coupled between the output of the first driving stage and the first voltage reference, the first current switch having a control terminal; and a first control switch coupled between the control terminal of the first current switch and the input of the first current generator, the first control switch having a control terminal for receiving a control input signal; and a second current switch connected in parallel with the first current switch and having a control terminal connected directly to the input of the first current generator.

60. The buffer of claim 59, further comprising a bias transistor having an output connected to the input of the first current generator such that the bias transistor forms a current mirror with the second current switch, the bias transistor having a size that is a whole multiple of a size of the second current switch.

* * * * *